(12) United States Patent
Park et al.

(10) Patent No.: US 10,680,209 B2
(45) Date of Patent: Jun. 9, 2020

(54) ORGANIC LIGHT EMITTING DIODE DISPLAY

(71) Applicant: Samsung Display Co., Ltd., Yongin-si, Gyeonggi-do (KR)

(72) Inventors: Soon-Ryong Park, Yongin-si (KR); Woo-Suk Jung, Yongin-si (KR); Hee-Chul Jeon, Yongin-si (KR); Eun-Ah Kim, Yongin-si (KR); Hee-Seong Jeong, Yongin-si (KR); Noh-Min Kwak, Yongin-si (KR); Chul-Woo Jeong, Yongin-si (KR); Joo-Hwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/473,386

(22) Filed: Mar. 29, 2017

(65) Prior Publication Data

US 2017/0207423 A1    Jul. 20, 2017

Related U.S. Application Data

(63) Continuation of application No. 12/654,362, filed on Dec. 17, 2009, now abandoned.

(30) Foreign Application Priority Data

Dec. 23, 2008   (KR) .................. 10-2008-0132374

(51) Int. Cl.
*G02B 5/23*   (2006.01)
*G02F 1/03*   (2006.01)
(Continued)

(52) U.S. Cl.
CPC ............ *H01L 51/5284* (2013.01); *G02B 5/23* (2013.01); *G09G 3/3291* (2013.01); (Continued)

(58) Field of Classification Search
CPC . H01L 51/5253; H01L 27/3269; H01L 51/56; C30B 7/00; G09G 3/3233; G02B 5/23; G01J 1/4228
See application file for complete search history.

(56) References Cited

U.S. PATENT DOCUMENTS 4,793,703 A    12/1988 Fretz, Jr.
5,084,650 A    1/1992 Ryu
(Continued)

FOREIGN PATENT DOCUMENTS

JP    9-331187        12/1997
JP    2007-220431     8/2007
KR    10-2004-0085025 10/2004

OTHER PUBLICATIONS

Partial European search report dated Mar. 9, 2010 of the corresponding European Patent Application No. 09180116.7.

*Primary Examiner* — Lin Li
(74) *Attorney, Agent, or Firm* — Lewis Roca Rothgerber Christie LLP

(57) ABSTRACT

An organic light emitting diode (OLED) display includes a substrate where OLEDs are formed and an encapsulation member fixed onto the substrate while covering the OLEDs. The encapsulation member includes a photochromic material so that the encapsulation member is colored by external light.

16 Claims, 7 Drawing Sheets

(51) Int. Cl.
*H05B 33/04* (2006.01)
*H01L 51/56* (2006.01)
*H01L 51/54* (2006.01)
*H01J 1/62* (2006.01)
*G02B 5/30* (2006.01)
*H01L 51/52* (2006.01)
*H01L 27/32* (2006.01)
*G09G 3/3291* (2016.01)

(52) U.S. Cl.
CPC ...... *H01L 27/3232* (2013.01); *H01L 27/3269* (2013.01); *H01L 51/524* (2013.01); *G09G 2310/027* (2013.01); *G09G 2320/0233* (2013.01); *G09G 2360/148* (2013.01); *G09G 2380/02* (2013.01)

(56) References Cited

U.S. PATENT DOCUMENTS

| | | | |
|---|---|---|---|
| 5,621,429 A * | 4/1997 | Yamaashi | G06F 3/04845 345/428 |
| 5,757,127 A | 5/1998 | Inoguchi et al. | |
| 5,957,564 A * | 9/1999 | Bruce | F21S 9/032 315/169.3 |
| 6,091,184 A | 7/2000 | De Vries | |
| 6,949,879 B1 * | 9/2005 | Wright | H01L 27/3244 313/504 |
| 7,289,257 B1 * | 10/2007 | Nakagoshi | B29C 45/14811 351/159.61 |
| 8,211,338 B2 * | 7/2012 | He | C07D 405/10 252/586 |
| 2002/0012064 A1 * | 1/2002 | Yamaguchi | H04N 5/2254 348/362 |
| 2002/0114054 A1 * | 8/2002 | Rietjens | G02B 1/105 359/241 |
| 2002/0124790 A1 * | 9/2002 | Era | C30B 7/00 117/1 |
| 2003/0030040 A1 | 2/2003 | Luthern et al. | |
| 2003/0035917 A1 | 2/2003 | Hyman | |
| 2003/0062519 A1 | 4/2003 | Yamazaki et al. | |
| 2004/0130770 A1 | 7/2004 | Nguyen et al. | |
| 2004/0188687 A1 * | 9/2004 | Arnold | H01L 27/3269 257/72 |
| 2005/0053719 A1 | 3/2005 | Ishida | |
| 2005/0122053 A1 | 6/2005 | Ko | |
| 2005/0168689 A1 | 8/2005 | Knox | |
| 2005/0239294 A1 | 10/2005 | Rosenblum et al. | |
| 2006/0014099 A1 | 1/2006 | Faler et al. | |
| 2006/0093844 A1 | 5/2006 | Conklin et al. | |
| 2006/0222973 A1 * | 10/2006 | Iftime | G02F 1/0126 430/19 |
| 2007/0001977 A1 | 1/2007 | Shin | |
| 2007/0054149 A1 * | 3/2007 | Cheng | H01L 27/322 428/690 |
| 2007/0090751 A1 | 4/2007 | Cok et al. | |
| 2007/0131949 A1 | 6/2007 | Liu | |
| 2007/0170850 A1 * | 7/2007 | Choi | H01L 51/5246 313/506 |
| 2007/0172971 A1 | 7/2007 | Boroson | |
| 2007/0176553 A1 * | 8/2007 | Kwak | C03C 8/24 313/512 |
| 2007/0182314 A1 * | 8/2007 | Oh | H05B 33/22 313/500 |
| 2007/0188085 A1 * | 8/2007 | Young | H01L 27/3269 313/506 |
| 2007/0253600 A1 | 11/2007 | Furukawa et al. | |
| 2007/0279337 A1 * | 12/2007 | Kim | G09G 3/3233 345/76 |
| 2008/0112049 A1 * | 5/2008 | Umemoto | B29C 55/04 359/487.02 |
| 2008/0132277 A1 | 6/2008 | Polak et al. | |
| 2008/0149865 A1 * | 6/2008 | Han | G02B 5/23 250/515.1 |
| 2008/0251780 A1 | 10/2008 | Li et al. | |
| 2009/0027319 A1 * | 1/2009 | Chen | G01J 1/4228 345/87 |
| 2009/0079328 A1 * | 3/2009 | Fedorovskaya | H01L 51/524 313/504 |
| 2009/0087639 A1 | 4/2009 | Li et al. | |
| 2009/0115321 A1 * | 5/2009 | Hayashi | H01L 51/5253 313/504 |
| 2009/0206378 A1 * | 8/2009 | Kim | G09G 3/3233 257/292 |
| 2010/0157585 A1 * | 6/2010 | Diekmann | F21S 6/002 362/228 |
| 2013/0234115 A1 * | 9/2013 | Song | H01L 51/56 257/40 |

* cited by examiner

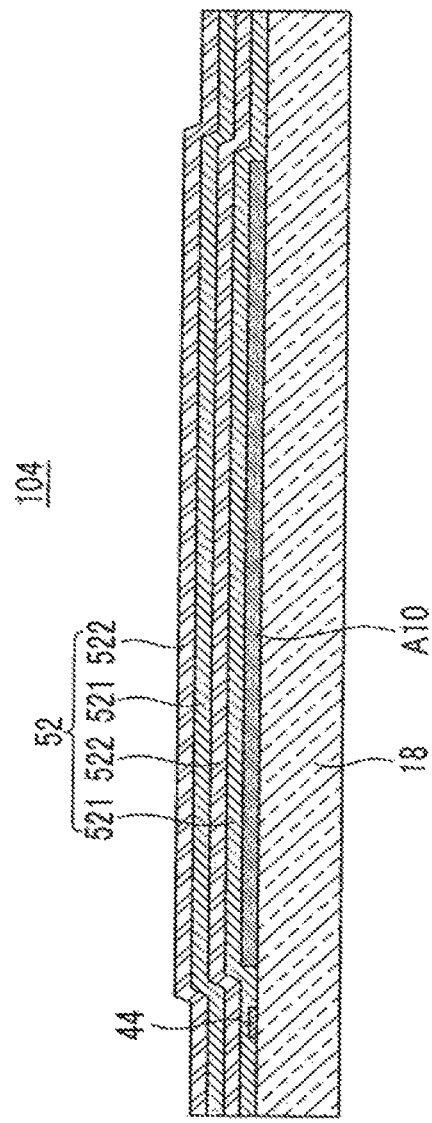

ORGANIC LIGHT EMITTING DIODE DISPLAY

CROSS-REFERENCE TO RELATED APPLICATION

This application is a continuation of U.S. patent application Ser. No. 12/654,362, filed Dec. 17, 2009, which claims priority to and the benefit of Korean Patent Application No. 10-2008-0132374, filed Dec. 23, 2008, the entire content of both of which is incorporated herein by reference.

BACKGROUND OF THE INVENTION

Field of the Invention

The present invention relates to an organic light emitting diode (OLED) display. More particularly, the present invention relates to an OLED display having improved visibility outdoors by minimizing reflection of external light.

Description of the Related Art

In an organic light emitting diode (OLED) display, display quality is greatly influenced by external light. That is, when external light is transmitted to the OLED display, reflection of the external light occurs in layers that form an organic emission element and a thin film transistor. For example, a metal layer used as an electrode has high light reflectivity so that the metal layer reflects most of the external light. The reflected external light is mixed with the light emitted from an organic emission layer such that visibility of the screen is undesirably deteriorated.

In order to solve the above-stated problem, a linear polarization film and a λ/4 phase delay film are disposed in a side where the external light is transmitted in a contemporary OLED display. In this structure, a polarizing axis is changed by 90 degrees when the external light passes through the linear polarization film and the λ/4 phase delay film and is then reflected by internal layers, and therefore the external light is absorbed since the external light cannot pass through the linear polarization film. Through this theory, the reflection of the external light can be suppressed to thereby enhance visibility.

In the above-described structure, however, half of the light (non-polarized light) emitted from the organic emission layer is blocked since the light cannot pass through the linear polarization film. Such a light loss undesirably decreases efficiency (luminance/power consumption) of the OLED display.

The above information disclosed in this Background section is only for enhancement of understanding of the background of the invention and therefore it may contain information that does not form the prior art that is already known in this country to a person of ordinary skill in the art.

SUMMARY OF THE INVENTION

It is therefore an object of the present invention to provide an improved an organic light emitting diode (OLED) display.

It is another object to provide an organic light emitting diode (OLED) display having an advantage of enhancing visibility by minimizing reflection of external light while maintaining high efficiency.

These and other objects may be attained in the practice of the principles of the present invention, with an OLED display constructed with a substrate where OLEDs are formed and an encapsulation member that is fixed onto the substrate while covering the OLEDs. The encapsulation member includes a photochromic material so that the encapsulation member is colored by external light.

The substrate may be a semiconductor substrate, and the encapsulation member may be an encapsulation substrate. The encapsulation substrate may be formed of glass. The OLED display may further include a photosensor disposed in an overlapped area of the semiconductor substrate and the encapsulation substrate.

The encapsulation member may be a thin film encapsulation layer comprising a plurality of inorganic layers and a plurality of organic layers that are alternately stacked. The farthermost layer among the plurality of inorganic layers and the plurality of organic layers from the substrate may include the photochromic material. The OLED display may further include a photosensor disposed between the thin film encapsulation layer and the substrate.

The photochromic material may include one selected from a group of silver halide, zinc halide, cadmium halide, copper halide, and magnesium halide.

The photochromic material may include one selected from a group of spiropyrane, spironaphthoxazine dye, diarylethene derivatives, dehydropyridine, furylfulgide derivatives, and azobenzene derivatives.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 9 is a cross-sectional view of an OLED display constructed as a fourth exemplary embodiment according to the principles of the present invention.

DETAILED DESCRIPTION OF THE EMBODIMENTS

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

Figure 1:
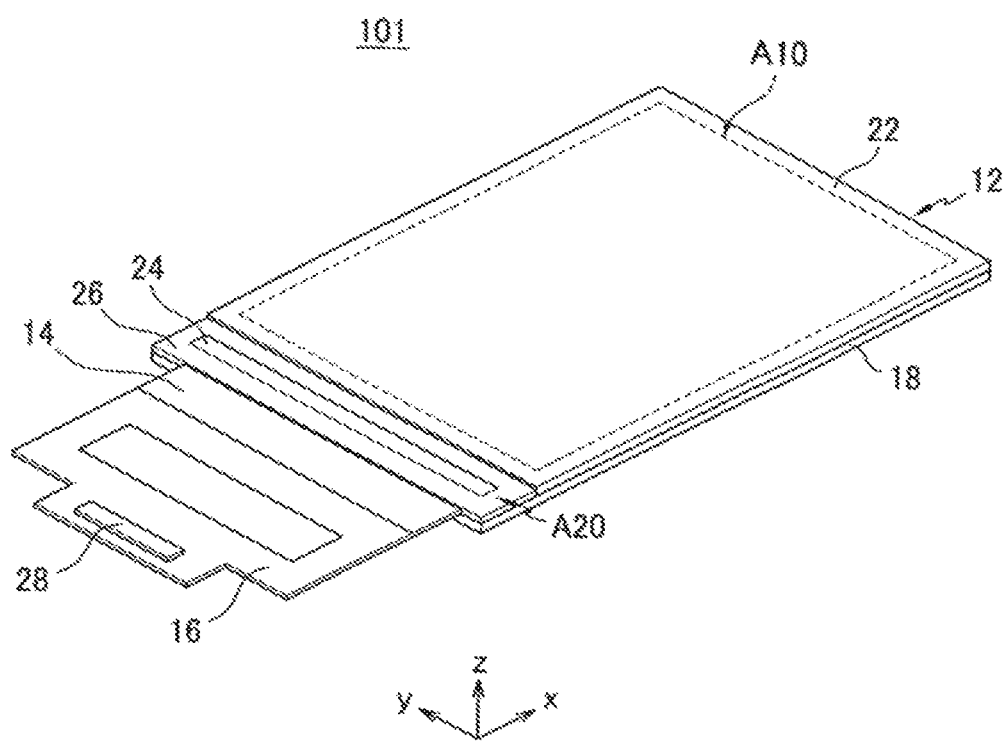
FIG. 1 is an oblique view of an organic light emitting diode (OLED) display constructed as a first exemplary embodiment according to the principles of the present invention.
Figure 2:
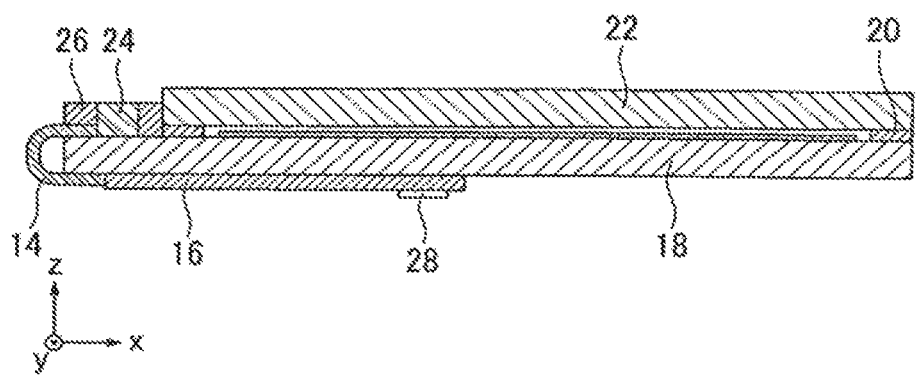
FIG. 2 is a cross-sectional view of the OLED display constructed as the first exemplary embodiment according to the principles of the present invention.

FIG. 1 and FIG. 2 respectively show an oblique view and a cross-sectional view of an organic light emitting diode (OLED) display constructed as a first exemplary embodiment according to the principles of the present invention.

Referring to FIG. 1 and FIG. 2, an OLED display 101 according to the first exemplary embodiment includes a panel assembly 12 having a display area A10 and a pad area A20 and displaying a predetermined video and visual image in display area A10, a flexible circuit board 14 fixed to pad area A20, and a printed circuit board 16 electrically connected to panel assembly 12 through flexible circuit board 14.

Panel assembly 12 includes a first substrate (or, a semiconductor substrate) 18 and a second substrate (or, an encapsulation substrate) 22 that is smaller than first substrate 18 and having an edge fixed to first substrate 18 by a sealant 20 (refer to FIG. 2). Display area A10 is located in an area where first substrate 18 and second substrate 22 are overlapped at an interior side of sealant 20, and pad area A20 is located on first substrate 18 at an external side of sealant 20.

A plurality of subpixels are disposed in a matrix pattern in display region A10 of first substrate 18, and a scan driver (not shown) and a data driver (not shown) are located between display area A10 and sealant 20 or at the external side of sealant 20 for driving the subpixels. In pad area A20 of first substrate 18, pad electrodes (not shown) for transmitting electrical signals to the scan and data drivers are located.

An integrated circuit chip 24 is mounted on pad area A20 of first substrate 18, and flexible circuit board 14 is electrically connected to the pad electrodes and integrated circuit chip 24. A protective layer 26 is formed around integrated circuit chip 24 and flexible circuit board 14 to cover the pad electrodes formed in pad area A20 for protection. In flexible circuit board 16, electronic components are provided for processing driving signals, and a connector 28 is provided for transmitting external signals to flexible circuit board 16.

In a rear side of panel assembly 12, a bezel (not shown) for increasing bending strength of panel assembly 12 or a buffering tape (not shown) for increasing impact resistance of panel assembly 12 may be formed. Flexible circuit board 14 fixed to pad area A20 is bent to the rear side of panel assembly 12 to make flexible circuit board 16 face the rear side of panel assembly 12.

Figure 3:
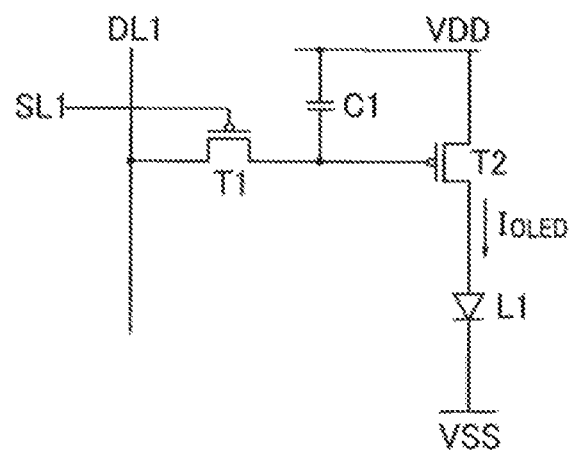
FIG. 3 shows a sub-pixel circuit of a panel assembly of FIG. 1.
Figure 4:
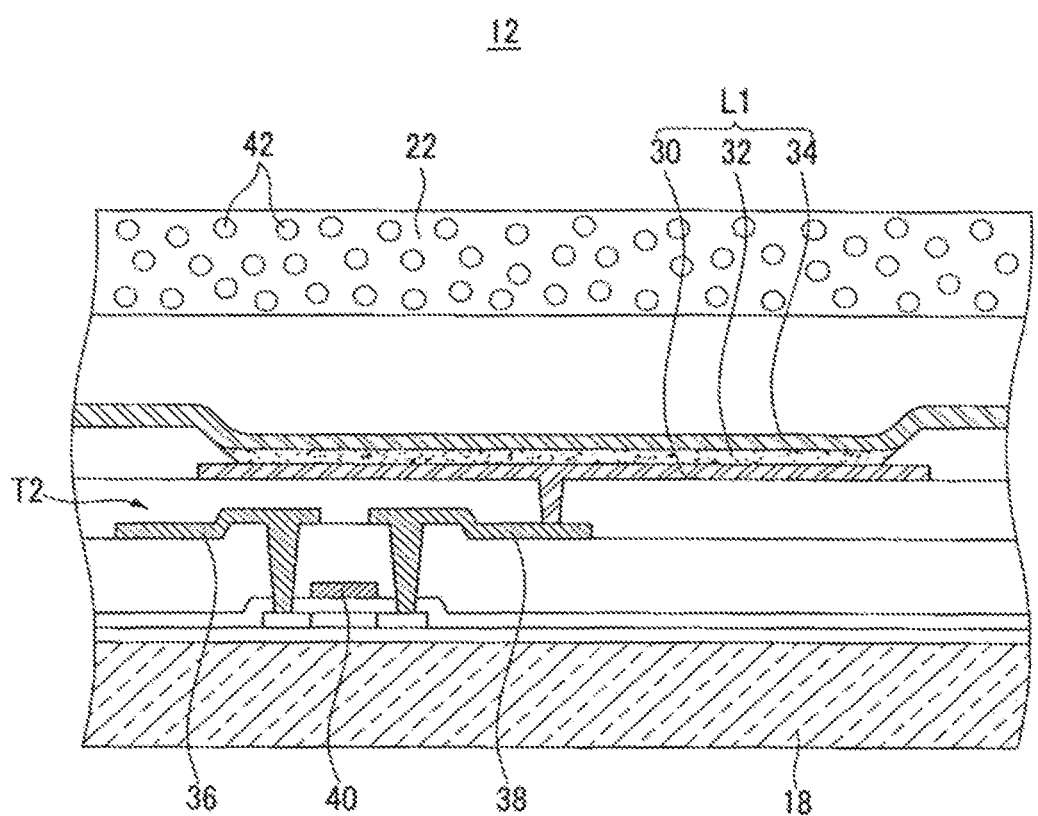
FIG. 4 and FIG. 5 are partial cross-sectional views of the panel assembly of FIG. 1.

FIG. 3 shows a structure of a sub-pixel of the panel assembly of FIG. 1, and FIG. 4 is a partial enlarged cross-sectional view of the panel assembly of FIG. 1.

Referring to FIG. 3 and FIG. 4, a sub-pixel of panel assembly 12 is formed of an OLED L1 and a driving circuit unit. OLED L1 includes an anode (hole injection electrode) 30, an organic emission layer 32, and a cathode (electron injection electrode) 34, and the driving circuit unit includes at least two thin film transistors T1 and T2 and at least one storage capacitor C1. The two thin film transistors T1 and T2 are a switching transistor T1 and a driving transistor T2, respectively.

Switching transistor T1 is connected to a scan line SL1 and a data line DL1, and transmits a data voltage input to data line DL1 according to a switching voltage that is input to scan line SL1 to driving transistor T2. Storage capacitor C1 is connected to switching transistor T1 and power source line VDD, and stores a voltage that corresponds to a voltage difference between a voltage transmitted from switching transistor T1 and a voltage supplied to power source line VDD.

Driving transistor T2 is connected to power source line VDD and storage capacitor C1, and supplies an output current $I_{OLED}$ that is proportional to the square of the difference between the voltage stored in storage capacitor C1 and a threshold voltage to OLED L1. OLED L1 emits light by output current $I_{OLED}$. Driving transistor T2 includes a source electrode 36, a drain electrode 38, and a gate electrode 40, and anode 30 of OLED L1 may be connected to drain electrode 38 of driving transistor T2. The configuration of the sub-pixel is not limited thereto, and may be variously modified.

In OLED L1, anode 30 is formed of a metal layer having a light reflection characteristic, and cathode 34 is formed of a transparent conductive layer. Therefore, light emitted from organic emission layer 32 passes through cathode 34 and second substrate 22 and is emitted out. Anode 30 reflects the light emitted toward first substrate 18 along with the light emitted from organic emission layer 32 to second substrate 22 to thereby enhance luminous efficiency. Second substrate 22 is an encapsulation member that covers OLEDs L1 for protection, and is made of glass.

In the first exemplary embodiment, a substrate on which external light is incident, that is, second substrate 22, includes a photochromic material which is an ultraviolet (UV) discoloration material. Second substrate 22 including the photochromic material has a characteristic that displays a color when UV light illuminates second substrate 22 and returns to a transparent state when the UV light does not illuminates second substrate 22. The photochromic material is mixed with glass during a manufacturing process of second substrate 22 and uniformly dispersed inside second substrate 22. In FIG. 4, photochromic material 42 is schematically illustrated as round particles.

Any well-known photochromic material can be used as photochromic material 42. For example, photochromic material 42 may be selected from a group consisting of silver halide, zinc halide, cadmium halide, copper halide, and magnesium halide. Alternatively, photochromic material 42 may be selected from a group consisting of spiropyrane, spironaphthoxazine dye, diarylethene derivatives, dehydropyridine, furylfulgide derivatives, and azobenzene derivatives. Photochromic material 42 included in second substrate 22 is not, however, limited thereto.

Figure 5:
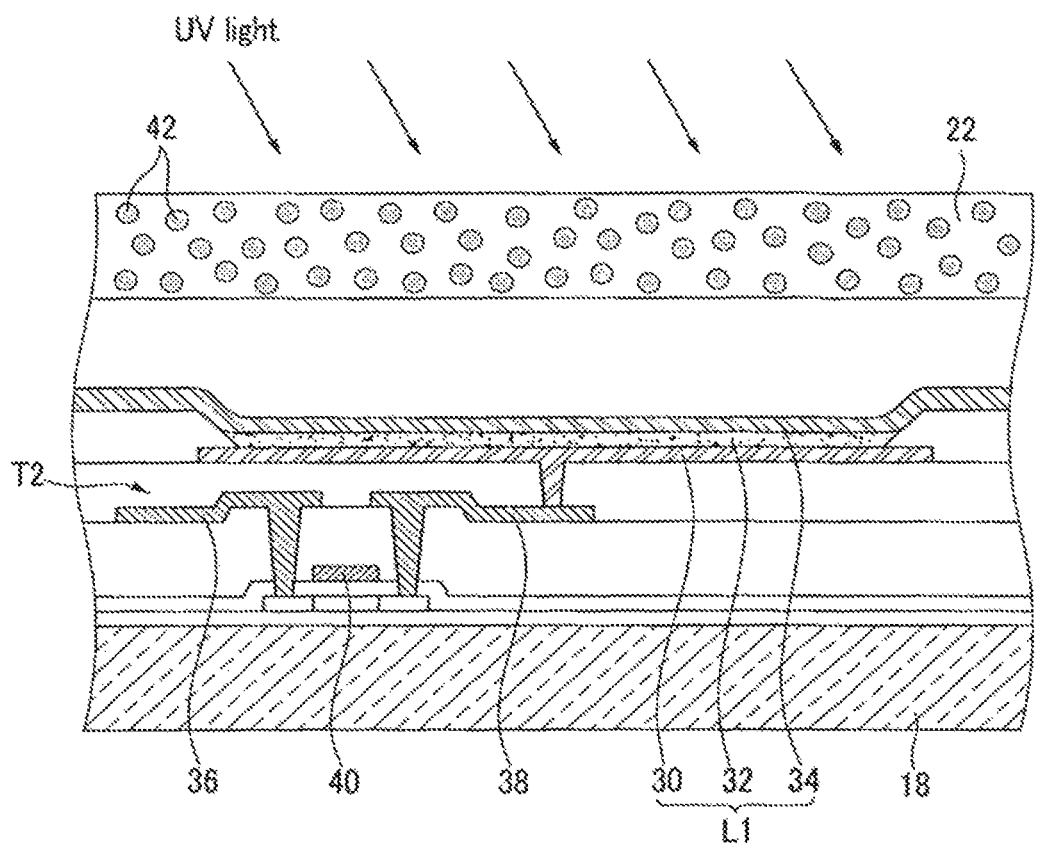

As described, second substrate 22 including photochromic material 42 has high light transmittance because second substrate 22 becomes colorless upon exposure to weak sunlight, for example in a normal indoor environment. In addition, under a strong sunlight condition, second substrate 22 becomes colored by photochromic material 42 and absorbs external light. That is, in the case that an electron device using OLED display 101 is observed outdoors during the daytime, second substrate 22 becomes colored (refer to FIG. 5).

Therefore, OLED display 101 according to the first exemplary embodiment of the principles of the present invention can increase visibility of the screen by reducing reflection of external light under a strong sunlight condition. In this case, transmittance of light emitted from organic emission layer 32 is reduced due to coloration of second substrate 22, but the amount of the reduced transmittance of light is less than that in a case in which a linear polarization film and a λ/4 phase delay film are applied, instead of the photochromic material, on OLEDs L1. Accordingly, efficiency (luminance/power consumption) of OLED display 101 can be improved.

Figure 6:
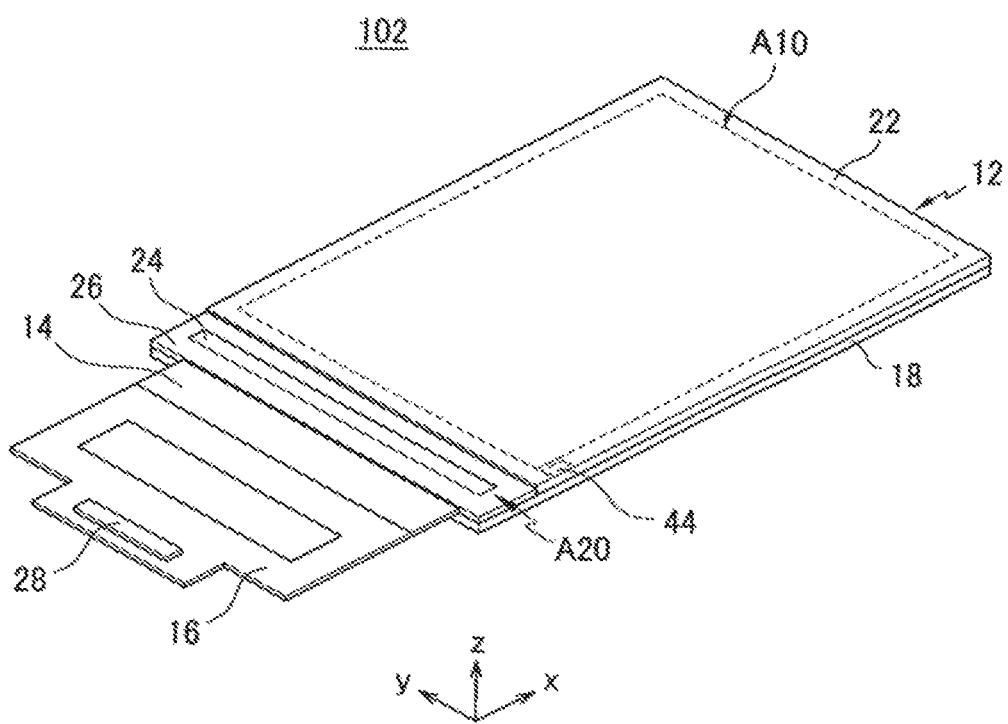
FIG. 6 is an oblique view of an OLED display constructed as a second exemplary embodiment according to the principles of the present invention.

FIG. 6 is an oblique view of an OLED display constructed a second exemplary embodiment according to the principles of the present invention.

Referring to FIG. 6, an OLED display 102 according to the second exemplary embodiment is the same as the OLED display of the first exemplary embodiment, except that a photosensor 44 is formed inside a panel assembly 12. Like reference numerals are used for like elements of the first exemplary embodiment.

Photosensor 44 is disposed on a portion of first substrate 18 which overlaps second substrate 22. Photosensor 44 may be disposed between sub-pixels in display area A10, or may be disposed between display area A10 and a sealant 20 (refer to FIG. 2). FIG. 6 illustrates a case in which photosensor 44 is exemplarily disposed at an external side of display area A10. Photosensor 44 detects the amount of light passing through second substrate 22 in order to increase the light emission intensity of organic emission layer 32 (refer to FIG. 4) when second substrate 22 is colored.

Figure 7:
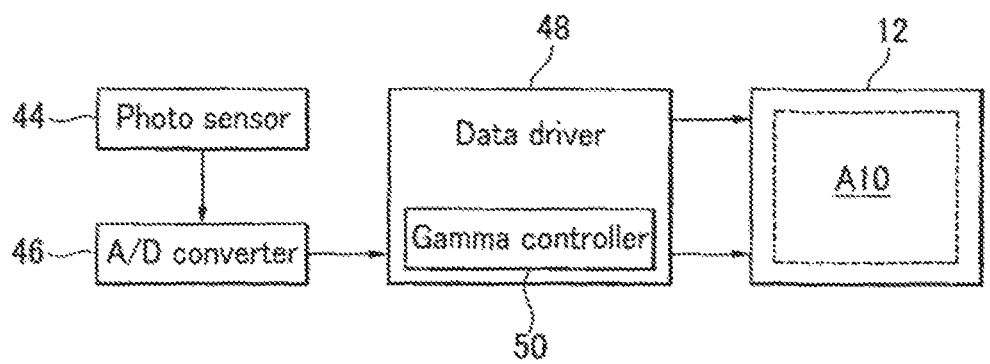
FIG. 7 is a block diagram of the OLED display according to the second exemplary embodiment of the present invention.

FIG. 7 is a block diagram of the OLED display according to the second exemplary embodiment of the principles of the present invention. Referring to FIG. 7, OLED display 102 includes photosensor 44, an analog to digital (A/D) converter 46, a data driver 48, and a panel assembly 12 where display area A10 is formed.

Photosensor 44 is formed of various types of sensors that can detect the amount of surrounding light. For example, photosensor 44 may be formed of one of a photodiode, a charge-coupled element, a charge injection element, a photomultiplier tube, a spectroradiometer, and a complementary metal-oxide semi-conductor (CMOS) photoelectric element. Photosensor 44 outputs a voltage signal or a current signal corresponding to the amount of light passing through second substrate 22. In this case, a coloration degree of second substrate 22 is increased as the strength of the external light is increased, and photosensor 44 can detect a small amount of external light.

A/D converter 46 receives a voltage or a current output from photosensor 44 as an analog signal and converts the analog signal into a digital signal. By using the digital signal provided from A/D converter 46, data driver 48 provides a data voltage that appropriately corresponds to the coloration degree of second substrate 22 to panel assembly 12. The data voltage output from data driver 48 is formed of individual data voltages representing red, green, and blue. For this, data driver 48 includes a gamma controller 50.

Gamma controller 50 includes a plurality of gamma curves that respectively correspond to the coloration degree of second substrate 22, detected by photosensor 44. Data driver 48 can control the data voltage provide to panel assembly 12 by using a data voltage setting value stored in gamma controller 50.

By the above-described configuration, OLED display 102 according to the second exemplary embodiment can enhance visibility and contrast ratio of the display by increasing light emission intensity of organic emission layer 30 (refer to FIG. 4) as the coloration degree of second substrate 22 is increased.

Figure 8:
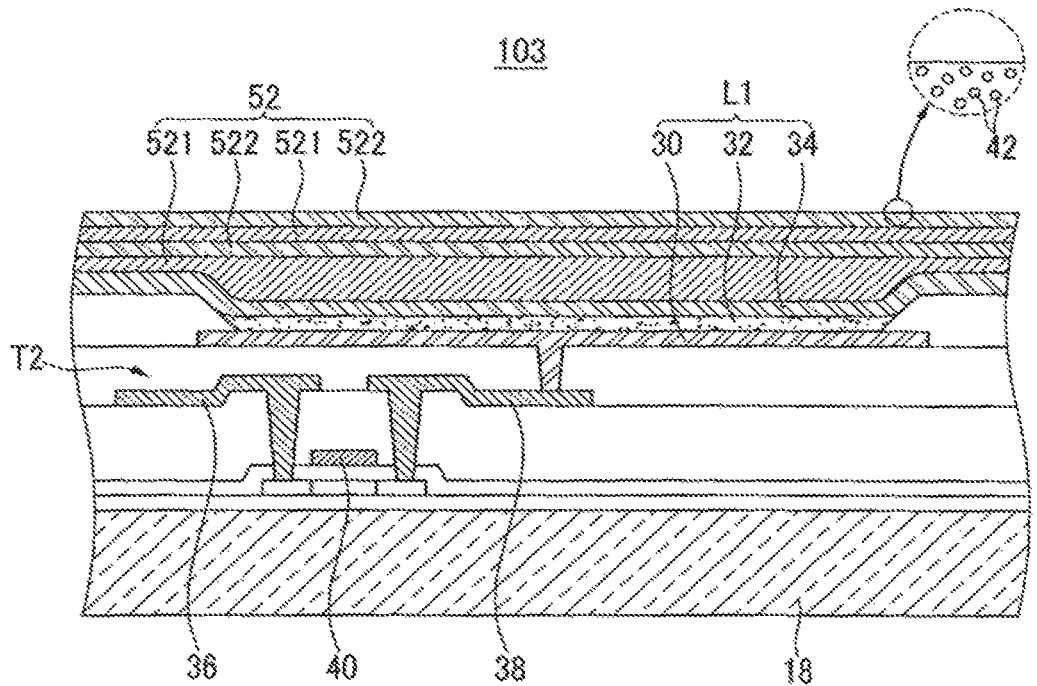
FIG. 8 is a partial enlarged cross-sectional view of an OLED display constructed as a third exemplary embodiment according to the principles of the present invention.

FIG. 8 is a partial enlarged cross-sectional view of an OLED display constructed as a third exemplary embodiment according to the principle of the present invention.

Referring to FIG. 8, an OLED display 103 according to the third exemplary embodiment is the same as the OLED display of the first exemplary embodiment except that a thin film encapsulation layer 52 is provided as an encapsulation member instead of the second substrate of the first exemplary embodiment. Like reference numerals are used for like elements of the first exemplary embodiment.

Thin film encapsulation layer 52 is formed or two or more inorganic layers 521 and two or more organic layers 522. Inorganic layers 521 and organic layers 522 are alternately stacked. FIG. 8 illustrates a case in which thin film encapsulation layer 52 is formed by alternately stacking each of two inorganic layers 521 and each of two organic layers 522.

Inorganic layer 521 may be formed of aluminum oxide or silicon oxide, and organic layer 522 may be formed of any one of epoxy, acrylate, and urethane acrylate. Inorganic layer 521 suppresses penetration of external moisture and oxygen, and organic layer 522 eases internal stress of inorganic layer 521 or fills micro-cracks and pinholes of inorganic layer 521.

Among the plurality of layers that form thin film encapsulation layer 52, at least one layer includes a photochromic material 42 so that thin film encapsulation layer 52 is colored by external light. When at least one inorganic layer 521 includes photochromic material 42, photochromic material 42 is mixed with an inorganic layer forming material during the inorganic layer forming process so that photochromic material 42 can be uniformly dispersed inside inorganic layer 521. When at least one organic layer 522 includes photochromic material 42, photochromic material 42 is mixed with an organic layer forming material during the organic layer forming process so that photochromic material 42 can be uniformly dispersed inside organic layer 522.

The uppermost layer (the farthermost layer from first substrate 18) among the plurality of layers forming thin film encapsulation layer 52 may include photochromic material 42. In this case, reflection of external light by the layers forming encapsulation layer 52 can be minimized. FIG. 8 illustrates a case in which photochromic material 42 is included in the uppermost organic layer 522 of thin film encapsulation layer 522.

FIG. 9 is a cross-sectional view of an OLED display constructed as a fourth exemplary embodiment according to the principles of the present invention.

Referring to FIG. 9, an OLED display 104 according to the fourth exemplary embodiment is the same as the OLED display of the third exemplary embodiment except that a photosensor 44 is provided in a lower portion of a thin film encapsulation layer 52. Like reference numerals are used for like elements of the first exemplary embodiment.

Photosensor 44 is disposed on a portion of a first substrate 18 which overlaps thin film encapsulation layer 52. Photosensor 44 may be disposed between sub-pixels in a display area A10, or may be disposed at an external side of display area A10. FIG. 9 illustrates a case in which photosensor 44 is exemplarily disposed at the external side of display area A10.

Photosensor 44 detects the amount of light passing through thin film encapsulation layer 52 in order to increase light emission intensity of an organic emission layer 32 (refer to FIG. 8) when thin film encapsulation layer 52 is colored. Photosensor 44 is connected to an A/D converter and a data driver, and configurations and functions of photosensor 44, the A/D converter, the data driver, and a gamma controller are the same as those of the OLED display of the second exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
 a substrate including a display region where OLEDs are disposed and a pad region where pad electrodes are disposed, the OLEDs comprising an anode, a cathode, and an organic emission layer between the anode and the cathode;
 a layer covering a thin film transistor on the substrate;
 an encapsulation member covering the display region and the organic emission layer, such that the organic emission layer is between the substrate and the encapsulation member; and
 a photosensor disposed between the substrate and the encapsulation member in an area where the substrate and the encapsulation member are overlapped and the organic emission layer and the encapsulation member are not overlapped,
 wherein the encapsulation member is a thin film encapsulation layer comprising a plurality of inorganic layers and at least one organic layer that are alternately stacked, and is spaced from the layer covering the thin film transistor, and
 wherein the OLEDs are configured to emit light from the organic emission layer toward the at least one organic layer to be emitted to an outside of the encapsulation member, the OLED display is configured to emit the light through the encapsulation member to an outside of the OLED display, and the at least one organic layer comprises a photochromic material comprising particles dispersed apart from one another such that the light emitted from the OLEDs is transmitted to the outside of the encapsulation member and such that the thin film encapsulation layer is colored and a light emission intensity of the organic emission layer is increased when an ultraviolet light illuminates thereon and the thin film encapsulation layer is returned to a transparent state when the ultraviolet light does not illuminate thereon.

2. The OLED display of claim 1, wherein the pad electrode transmits electrical signals to a scan driver and a data driver.

3. The OLED display of claim 1, wherein the inorganic layer is formed of one selected from a group of aluminum oxide or silicon oxide.

4. The OLED display of claim 1, wherein the at least one organic layer is formed of one selected from a group of epoxy, acrylate, and urethane acrylate.

5. The OLED display of claim 1, wherein the photochromic material comprises one selected from a group of silver halide, zinc halide, cadmium halide, copper halide, and magnesium halide.

6. The OLED display of claim 1, wherein the photochromic material comprises one selected from a group of spiropyrane, spironaphthoxazine dye, diarylethene derivatives, dehydropyridine, furylfulgide derivatives, and azobenzene derivatives.

7. The OLED display of claim 1, further comprising: an analog to digital (A/D) converter receiving an analog signal output from the photosensor, and converting the analog signal into a digital signal;
 a data driver receiving the digital signal output from the analog to digital converter, and providing a data voltage that corresponds to a coloration degree of the encapsulation member.

8. The OLED display of claim 7, wherein the data driver further comprises a gamma controller.

9. The OLED display of claim 1, wherein the photochromic material extends continuously across at least the display region.

10. The OLED display of claim 1, wherein the thin film encapsulation layer includes a flat portion that overlaps with at least the display region.

11. The OLED display of claim 1, wherein the thin film encapsulation layer is colored by external light.

12. The OLED display of claim 1, wherein the photochromic material is an ultraviolet discoloration material.

13. The OLED display of claim 1, wherein the at least one organic layer comprises a plurality of organic layers.

14. The OLED display of claim 13, wherein the farthest layer among the plurality of organic layers from the substrate includes the photochromic material.

15. The OLED display of claim 1, wherein the farthest layer among the plurality of inorganic layers and the at least one organic layer from the substrate includes the photochromic material.

16. The OLED display of claim 1, wherein the thin film encapsulation layer includes a stepped portion that overlaps the substrate between an edge of the display region and an edge of the substrate.

* * * * *